(12) United States Patent
Kayser

(10) Patent No.: US 11,538,698 B2
(45) Date of Patent: Dec. 27, 2022

(54) CLEAVE SYSTEMS HAVING SPRING MEMBERS FOR CLEAVING A SEMICONDUCTOR STRUCTURE AND METHODS FOR CLEAVING SUCH STRUCTURES

(71) Applicant: GlobalWafers Co., Ltd., Hsinchu (TW)

(72) Inventor: Justin Scott Kayser, Wentzville, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 118 days.

(21) Appl. No.: 17/017,319

(22) Filed: Sep. 10, 2020

(65) Prior Publication Data

US 2021/0098272 A1    Apr. 1, 2021

Related U.S. Application Data

(60) Provisional application No. 62/906,860, filed on Sep. 27, 2019.

(51) Int. Cl.
| | | |
|---|---|---|
| *H01L 21/67* | (2006.01) | |
| *H01L 21/683* | (2006.01) | |
| *H01L 21/78* | (2006.01) | |

(52) U.S. Cl.
CPC .... *H01L 21/67092* (2013.01); *H01L 21/6838* (2013.01); *H01L 21/78* (2013.01)

(58) Field of Classification Search
CPC .................. H01L 21/67092; H01L 21/6838
See application file for complete search history.

(56) References Cited

U.S. PATENT DOCUMENTS

| | | |
|---|---|---|
| 5,676,364 A | 10/1997 | Shiiki et al. |
| 6,263,941 B1 | 7/2001 | Bryan et al. |
| 6,635,516 B1 | 10/2003 | Komatsu |
| 7,427,554 B2 | 9/2008 | Henley et al. |
| 9,640,711 B2 | 5/2017 | Henley et al. |
| 2006/0286769 A1 | 12/2006 | Tsuchiya et al. |
| 2013/0062020 A1 | 3/2013 | Ries et al. |
| 2015/0101758 A1 | 4/2015 | Honda et al. |
| 2018/0071771 A1 | 3/2018 | Kajino et al. |
| 2018/0222176 A1 | 8/2018 | Watanabe et al. |
| 2019/0247050 A1* | 8/2019 | Goldsmith ....... A61B 17/12181 |

FOREIGN PATENT DOCUMENTS

JP    2004335930 A  *  11/2004

OTHER PUBLICATIONS

International Search Report and Written Opinion for PCT/US2020/051180, dated Nov. 26, 2020 (14 pages).

* cited by examiner

*Primary Examiner* — Mohammad M Choudhry
(74) *Attorney, Agent, or Firm* — Armstrong Teasdale LLP

(57) ABSTRACT

Cleave systems for cleaving a semiconductor structure are disclosed. The cleave systems may include a cleave arm that is moveable from a starting position to a raised position in which a cleave stress is applied to the semiconductor structure. Spring members store energy as the cleave arm is raised with the stored spring energy causing the structure to cleave into two pieces upon initiation of the cleave across the structure.

9 Claims, 8 Drawing Sheets

FIG. 2

CLEAVE SYSTEMS HAVING SPRING MEMBERS FOR CLEAVING A SEMICONDUCTOR STRUCTURE AND METHODS FOR CLEAVING SUCH STRUCTURES

CROSS-REFERENCE TO RELATED APPLICATION

This application claims the benefit of U.S. Provisional Patent Application No. 62/906,860, filed Sep. 27, 2019, which is incorporated herein by reference in its entirety.

FIELD OF THE DISCLOSURE

The field of the disclosure relates to cleave systems for cleaving a semiconductor structure and, particularly, to cleave systems that use stored spring energy to separate the semiconductor structure into two pieces. The field of the disclosure also relates to methods for cleaving semiconductor structures by use of such cleave systems.

BACKGROUND

Conventional cleave systems use suction cups that are under vacuum to grasp the top and bottom surfaces of the structure to be cleaved. A set of upper suction cups that grasp the top surface of the structure is connected to a cleave arm. A motor applies an upward force to the cleave arm to cause the semiconductor structure to be under tension. Once under sufficient tension, a blade is contacted with the peripheral edge of the semiconductor structure to initiate the cleave. The cleave arm moves upward after the cleave is initiated and the cleave propagates along the semiconductor structure from the edge contacted by the blade toward the opposite edge.

The cleave process causes the semiconductor structure to be separated into two pieces. To fabricate a silicon-on-insulator structure by a cleave process, a "donor" structure is separated from a layered structure to leave a silicon device layer disposed on an insulator layer that is supported by a handle wafer. The quality of the surface of the resulting structure (e.g., the surface roughness) is dependent on the quality of the cleave.

Conventional cleave methods often result in an undesirable roughness pattern. Higher roughness after cleaving leads to higher surface roughness of the finished structure (e.g., SOI structure) as measured by atomic force microscopy. High cleave roughness also causes hillocks to form during epitaxial growth. Such hillocks are detected as light point defects at final inspection. Conventional cleave methods also result in inconsistent cleave pull force which causes formation of surface roughness cleave arcs. Such cleave arcs generally have an arc center on the side of the cleave initiation point with the ends of the arc being perpendicular to the wafer edge. As the cleave propagates across the wafer, the arc ends stay perpendicular to the edge with the arc becoming straight and possibly reversing curvature as it nears the point diametrically opposed to the cleave initiation point.

The quality of the cleave is dependent on the cleave control system, the mass properties of the cleave arm, the motor characteristics, and control parameters including initial tension and relative blade location. These parameters are difficult to tune to improve the quality of the cleave.

A need exists for new cleave systems that result in a cleaved structure with improved surface roughness characteristics and for cleave methods that involve use of such cleave systems.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a cleave system for cleaving a semiconductor structure having a top surface and a bottom surface generally parallel to the top surface. The cleave system includes a cleave arm that is moveable from a starting position to a raised position in which a cleave stress is applied to the semiconductor structure. The cleave system includes a suction member for grasping the semiconductor structure on the top surface of the semiconductor structure. A suction rod extends through the cleave arm. The suction rod is connected to the suction member toward a first end of the suction rod. A spring member applies a cleave force to the semiconductor structure when the cleave arm is in the raised position.

Another aspect of the present disclosure is directed to a cleave system for cleaving a semiconductor structure having a top surface and a bottom surface generally parallel to the top surface. The cleave system includes one or more suction cups for grasping the semiconductor structure on the top surface of the semiconductor structure. A suction rod is connected to the one or more suction cups toward a first end of the suction rod. A spring member applies a cleave force to the semiconductor structure during cleaving. The suction rod extends through the spring member.

Yet another aspect of the present disclosure is directed to a method for cleaving a semiconductor structure having a top surface and a bottom surface generally parallel to the top surface. The top surface of the semiconductor structure is contacted with a suction cup. A vacuum is applied in the suction cup to grasp the top surface of the semiconductor structure. A cleave arm is moved from a starting position to a raised position to cause a spring member to exert a cleave force on the semiconductor structure. The spring member stores spring energy when the cleave arm is raised. The semiconductor structure is contacted with a blade to initiate cleaving the semiconductor structure when the cleave arm is in the raised position. The stored spring energy is released after contacting the semiconductor structure with the blade to separate the semiconductor structure along a cleave plane into two pieces.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
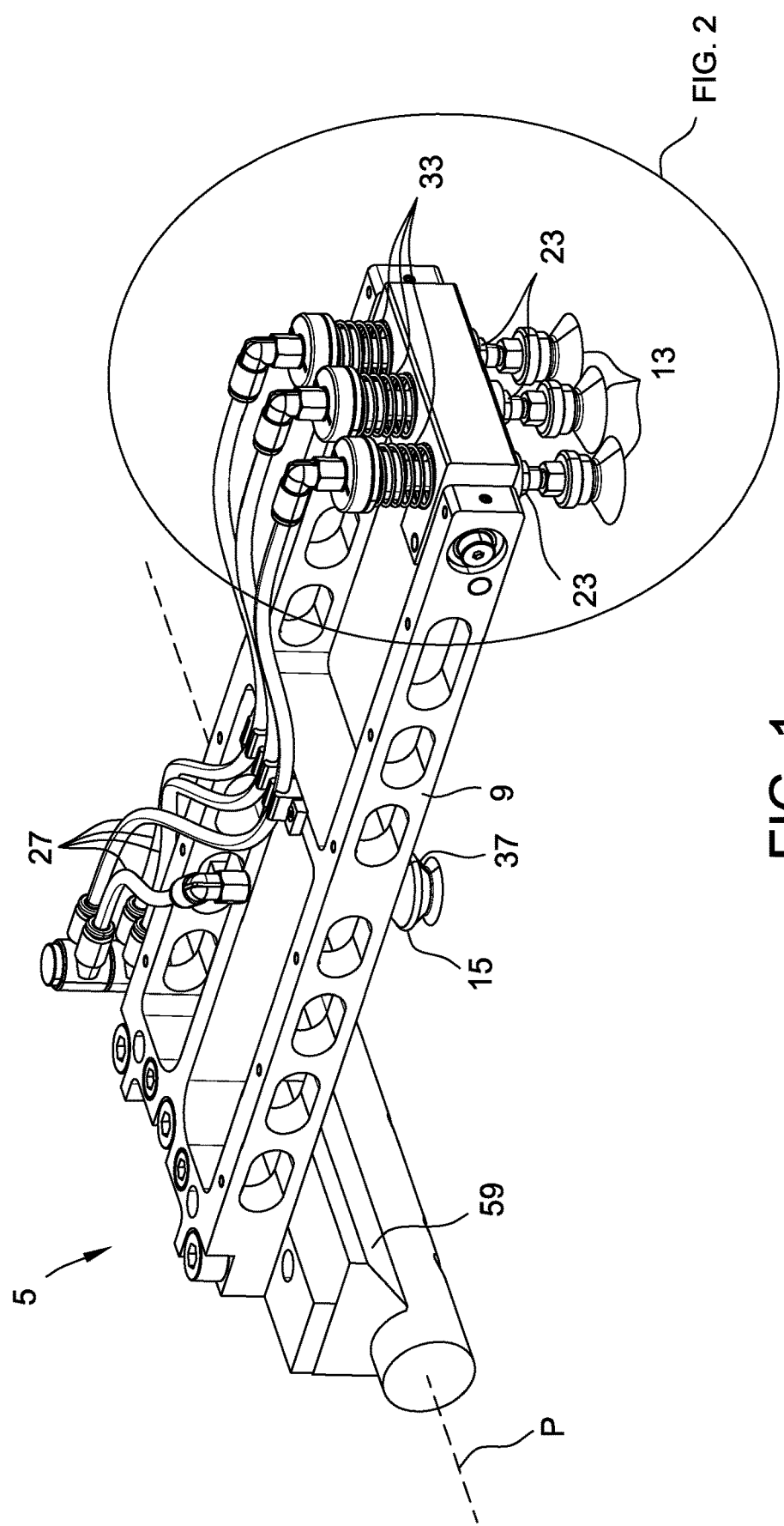
FIG. 1 is a perspective view of a cleave system for cleaving a semiconductor structure.

Referring now to FIG. 1, a cleave system 5 for cleaving a semiconductor structure S (FIG. 5) is shown. The cleave system 5 includes a cleave arm 9 and suction members 13 that extend from the cleave arm 9 for grasping the semiconductor structure S. The suction members 13 extend from suction rods 23 that extend through the cleave arm 9. The cleave system 5 includes spring members 33 that release stored spring energy to separate the semiconductor structure as described further below. To exert a tensile stress on the semiconductor structure S, the cleave arm 9 moves from a starting position (FIG. 5) to a raised position (FIG. 6) in which the spring members 33 and/or cleave arm 9 exert a cleave force on the semiconductor structure S.

The semiconductor structure S which is cleaved in accordance with embodiments of the present disclosure may generally be any structure which cleaves upon application of a cleave force to the semiconductor structure and upon cleave initiation (e.g., use of blade that contacts the peripheral edge). Suitable structures may have a weakened zone formed within the structure such as a weakened zone formed by ion implantation. Some structures may include layered silicon-on-insulator structures (e.g., having a donor wafer disposed on a dielectric layer and handle wafer) which are cleaved to form the silicon-on-insulator structure (e.g., to form a silicon device layer on a dielectric layer disposed on a handle wafer by cleaving the donor wafer). The semiconductor structure S includes a top surface 41 (FIG. 5) and a bottom surface 43 generally parallel to the top surface 41. The semiconductor structure S also includes a peripheral edge 45 that extends from the top surface 41 to the bottom surface 43.

The cleave system 5 includes suction members 13 for grasping the semiconductor structure S on the top surface 41 of the semiconductor structure S toward a cleave propagation leading edge 21 (FIG. 5) of the structure S. In the illustrated embodiment, the suction members 13 are suction cups. In other embodiments, adhesive members may be used to connect a chuck to each of the top and bottom surfaces of the semiconductor structure S to apply a cleave force to the structure S. While the illustrated embodiment includes first, second and third suction members 13 for grasping the top surface 41 of the semiconductor structure S toward the cleave propagation leading edge 21 of the structure S, it should be understood that the cleave system 5 may include more or less suction members 13 (e.g., one, two, three, four, five or six or more suction members). Further, while the illustrated embodiment includes first, second and third suction rods 23 and first, second and third spring members 33, the cleave system 5 may include more or less suction rods 23 and/or spring members 33 (e.g., one, two, three, four, five, or six or more suction rods 23 and/or one, two, three, four, five, or six or more spring members 33).

Figure 2:
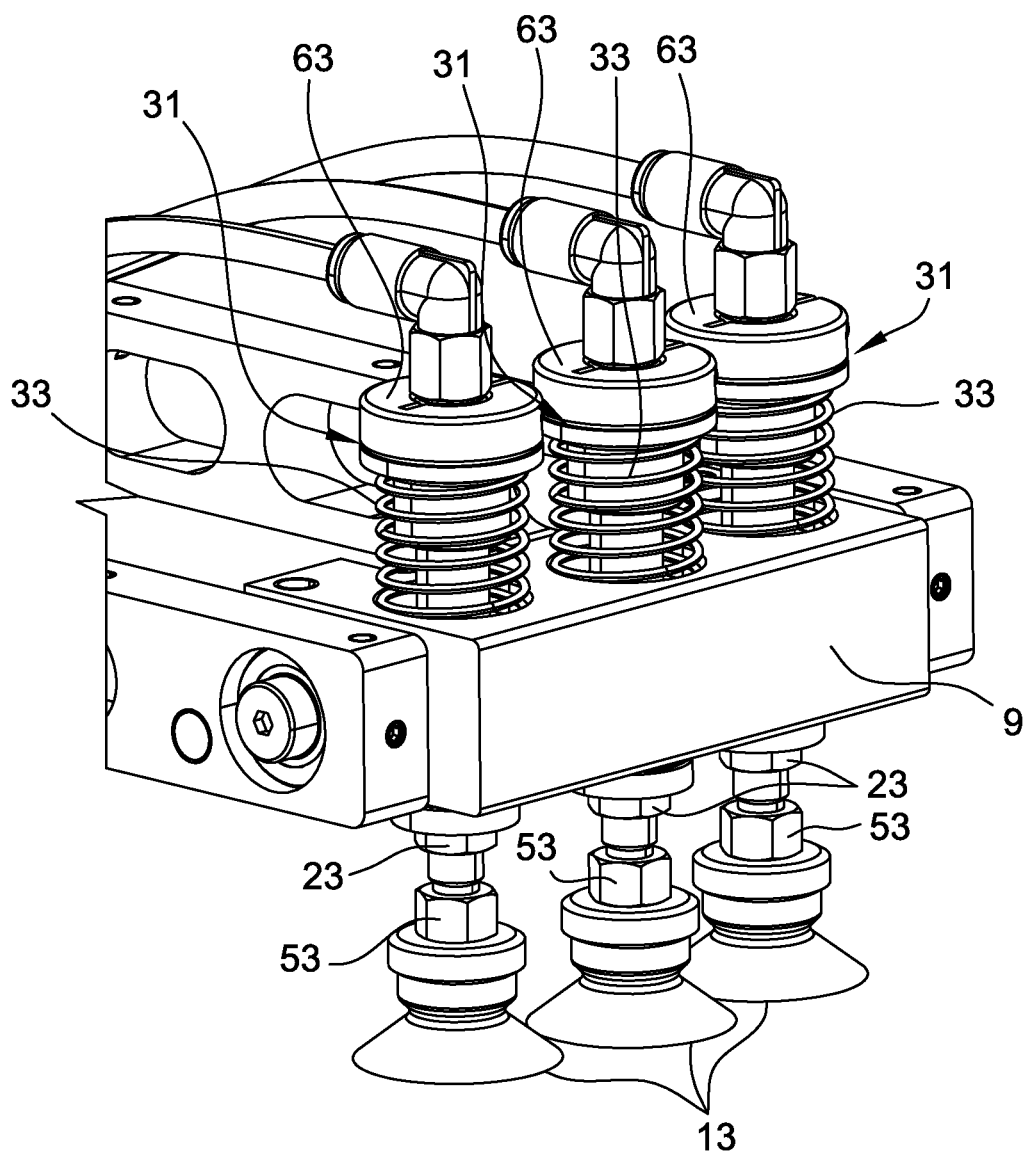
FIG. 2 is a detailed perspective view of a portion of the cleave system.
Figure 3:
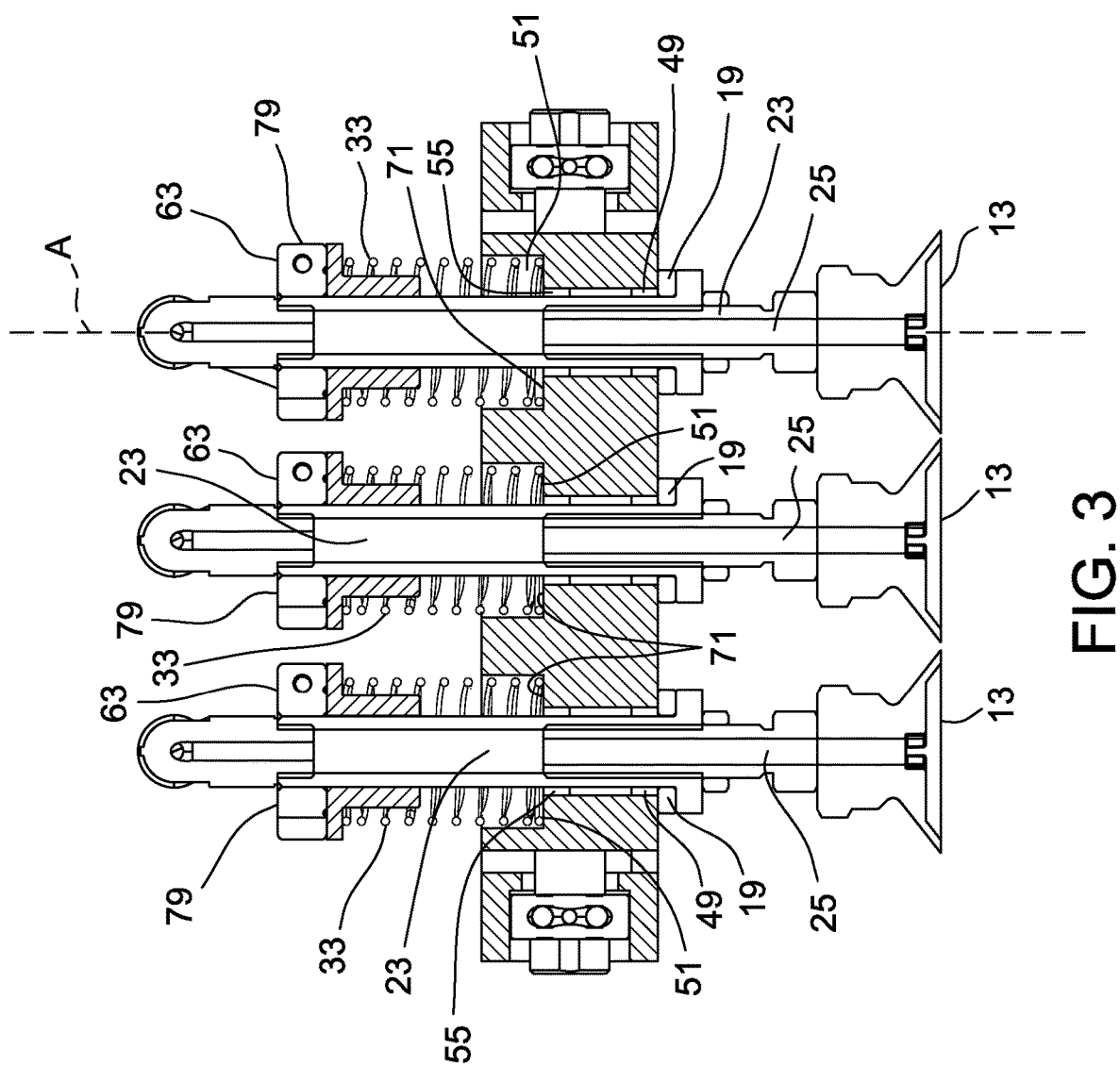
FIG. 3 is a cross-section side view of the cleave system with the cleave arm at a starting position.

Each suction member 13 is connected to a corresponding suction rod 23 toward a first end 53 (FIG. 2) of the suction rod 23. Each suction rod 23 extends through the cleave arm 9. The cleave arm 9 and suction rods 23 are capable of moving relative to each other along the suction rod axis A (FIGS. 3 and 4) as the cleave arm moves from its starting position (FIG. 5) to the raised position (FIG. 6) and when the semiconductor structure is separated (FIG. 7). The cleave arm 9 includes chambers 11 (FIG. 4) formed therein in which the suction rods 23 move relative to the cleave arm 9.

The suction rods 23 extend through a corresponding spring member 33. In the illustrated embodiments, the suction rods 23 are not connected to the cleave arm 9 and the cleave arm 9 and suction rods 23 may move relative to each other along the suction rod axis A. The cleave system 5 includes upper and lower bearings 49, 55 (FIG. 3; e.g., linear bushings as shown) that enable the cleave arm 9 and suction rods 23 to move relative to each other. The suction rods 23 move within the bearings 49, 55 as the cleave arm moves from the starting position (FIG. 5) to the raised position (FIG. 6) and during release of stored spring energy during cleaving of the semiconductor structure (FIG. 7). A seal member 19 (e.g., Teflon pad) seals the chamber 11 (FIG. 4) in which the suction rods 23 move relative to the cleave arm 9 to reduce particle contamination of the semiconductor structure S.

Each suction rod 23 includes a channel 25 (FIG. 3) defined therein that is fluidly connected to the suction cup 13 to apply a vacuum between the suction cup 13 and top surface 41 (FIG. 5) of the semiconductor structure S. The channels 25 are connected to vacuum conduits 27 (FIG. 1) that are fluidly connected to the vacuum source (e.g., vacuum pump). Once a vacuum is applied, the suction members 13 seal to the top surface 41 of the semiconductor structure S.

Figure 4:
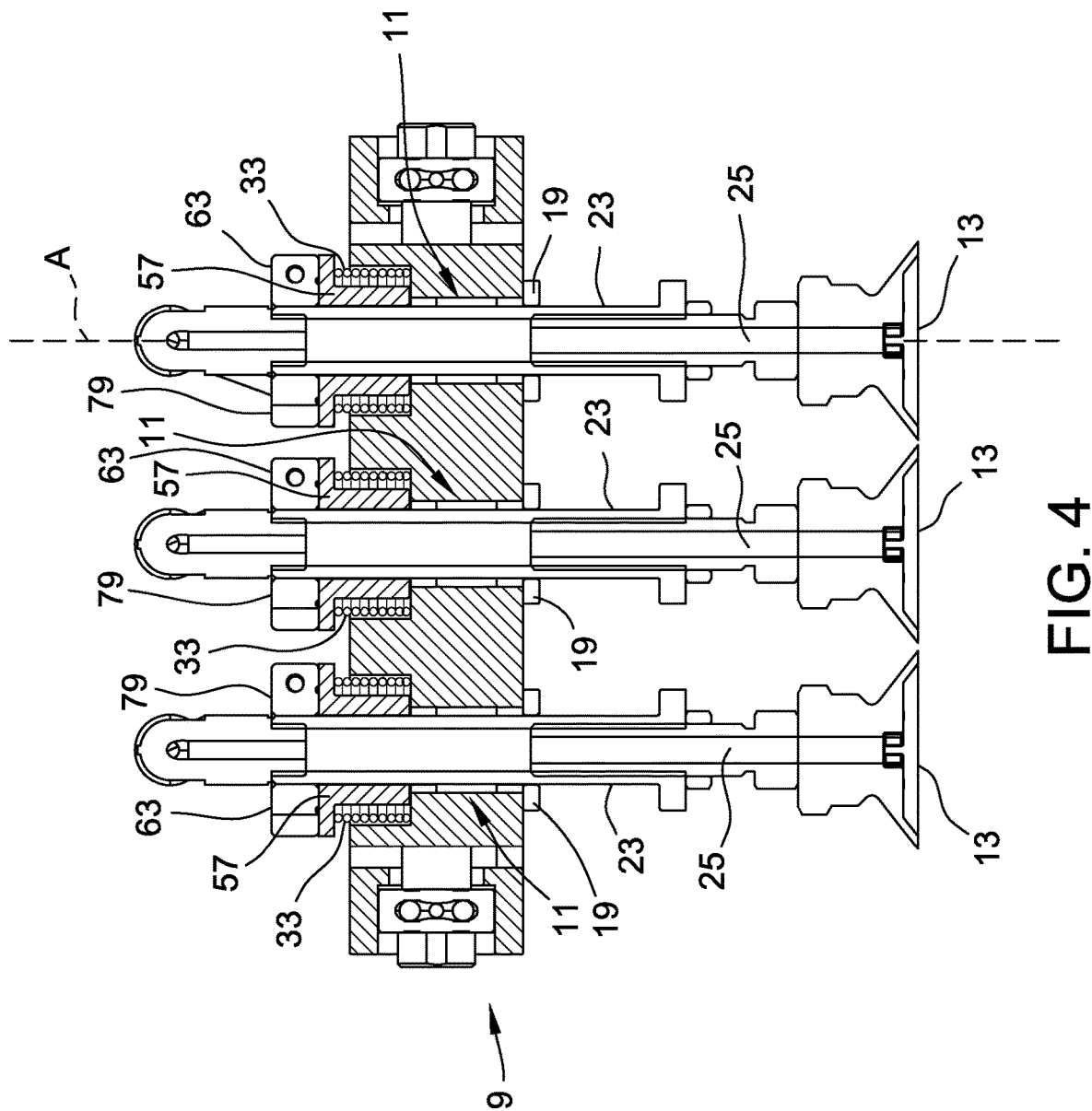
FIG. 4 is a cross-section side view of the cleave system with the cleave arm at a raised position and the spring members being compressed.

Each spring member 33 is disposed between a collar 63 and the cleave arm 9. Each collar 63 extends radially outward from a respective suction rod 23 toward a second end 31 of the suction rod 23. The spring members 33 are at least partially received in recesses 51 (FIG. 3) defined in the cleave arm 9. Each recess 51 has a floor 71 that abuts the respective spring member 33. The spring member 33 is secured by a retainer 57 (FIG. 4) that acts as a stop to prevent over-compression of the spring members 33. Relative movement of the suction rod 23 and cleave arm 9 is prevented when the retainer 57 contacts the floor 71 as shown in FIG. 4.

In some embodiments, each collar 63 is part of a collar clamp 79. The collar clamp 79 is adjustable such that the clamp 79 may be moved and re-secured along the longitudinal axis A of the suction rod 23. In this manner, the compression of the spring members 33 may be adjusted (e.g., the pre-compression of the spring members 33 when in the starting position of the cleave arm 9 may be adjusted). Changing the pre-compression of the spring members 33 changes the pull force at the end of the spring energy release and may change the dynamics of the cleave wave and surface roughness. Increasing the pre-load force increases the acceleration which is reduced as the spring releases energy. Matching of where the spring energy is minimum as the energy reduces and the when the cleave arm rotation begins may also affect the final surface roughness.

In the illustrated embodiment, the spring members 33 are helical compression springs that apply a cleave force on the semiconductor structure S when compressed (i.e., when the cleave arm 9 is raised). In other embodiments, the spring member 33 is an extension spring (e.g., the spring member is disposed below the cleave arm and is connected to the cleave arm and a retention member disposed below the cleave arm). In yet other embodiments, the spring member 33 is one or more belleville springs (i.e., a coned disk spring) such as a set of two or more stacked belleville springs. Other spring members such as a compressed air spring, compressed elastomer or an extension elastomer may be used in other embodiments.

Figure 5:
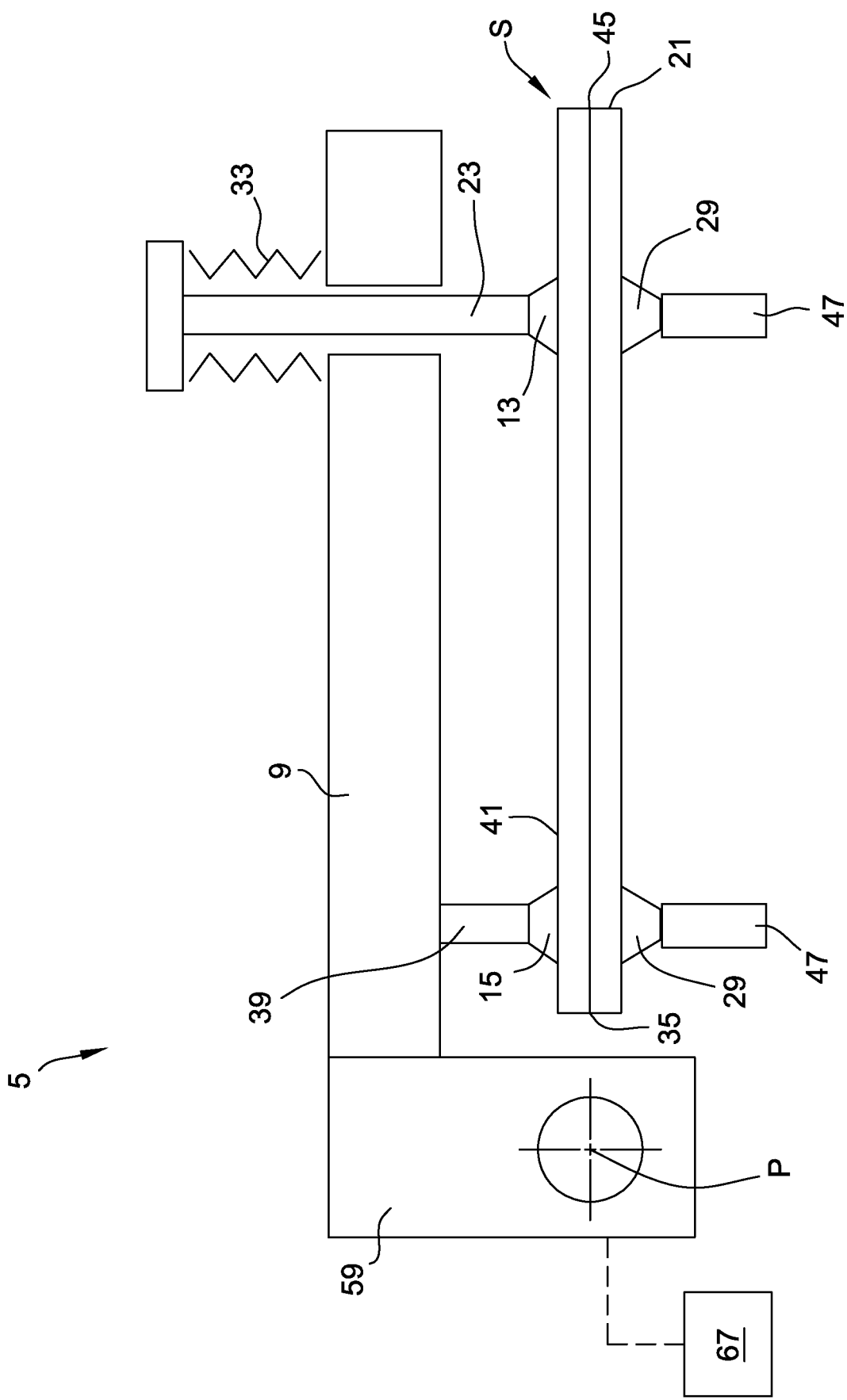
FIG. 5 is a schematic front view of the cleave system with the cleave arm in the starting position.

As shown in FIG. 5, the cleave system 5 includes a first set of forward suction members 13 that grasp the top surface 41 of the semiconductor structure S toward a cleave propagation leading edge 21 of the structure S (e.g., three suction members 13 as shown in FIG. 1). The cleave system 5 also includes one or more rear suction member 15 (e.g., suction cups) that grasp the top surface 41 of the semiconductor structure S toward the cleave propagation trailing edge 35 (i.e., the rear suction member 15 is disposed radially inward to the first set of suction members 13).

Because the cleave arm 9 moves to a raised position (FIG. 6) before the semiconductor structure S cleaves, the rear suction member 15 may be configured to accommodate movement of the cleave arm 9. In some embodiments, the rear suction member 15 is a bellows suction cup that accommodates changes in distance between the cleave arm 9 and the semiconductor structure S. The bellows suction cup 15 includes a bellows section 37 (FIG. 1) that is capable of flexing and/or stretching as the cleave arm 9 moves. The rear suction cup 15 is connected to a rear suction rod 39 that is connected to the cleave arm 9. The rear suction rod 39 may be rigid or flexible to allow for movement of the cleave arm 9.

Referring now to FIG. 5, in addition to suction members 13 that grasp the top surface 41 of the semiconductor structure S, the cleave system 5 includes a set of one or more suction members 29 that grasp the bottom surface 43 of the semiconductor structure S. The suction members 29 are connected to suction rods 47 that are fixed in position (i.e., do not move) when the cleave arm 9 is raised.

In accordance with embodiments of the present disclosure, to cleave a semiconductor structure, the semiconductor structure S is set on the lower suction members 29 (FIG. 5) such that the lower suction members 29 contact the bottom surface 43 of the semiconductor structure S. The cleave arm 9 is lowered to contact the top surface 41 of the semiconductor structure S with the upper suction members 13, 15. A vacuum is applied in the lower suction members 29 to grasp the bottom surface 43 of the semiconductor structure S. A vacuum is also applied in the upper suction members 13, 15 through vacuum conduits 27 and suction rod channels 25 (FIG. 5) to grasp the top surface 41 of the semiconductor structure S.

Figure 6:
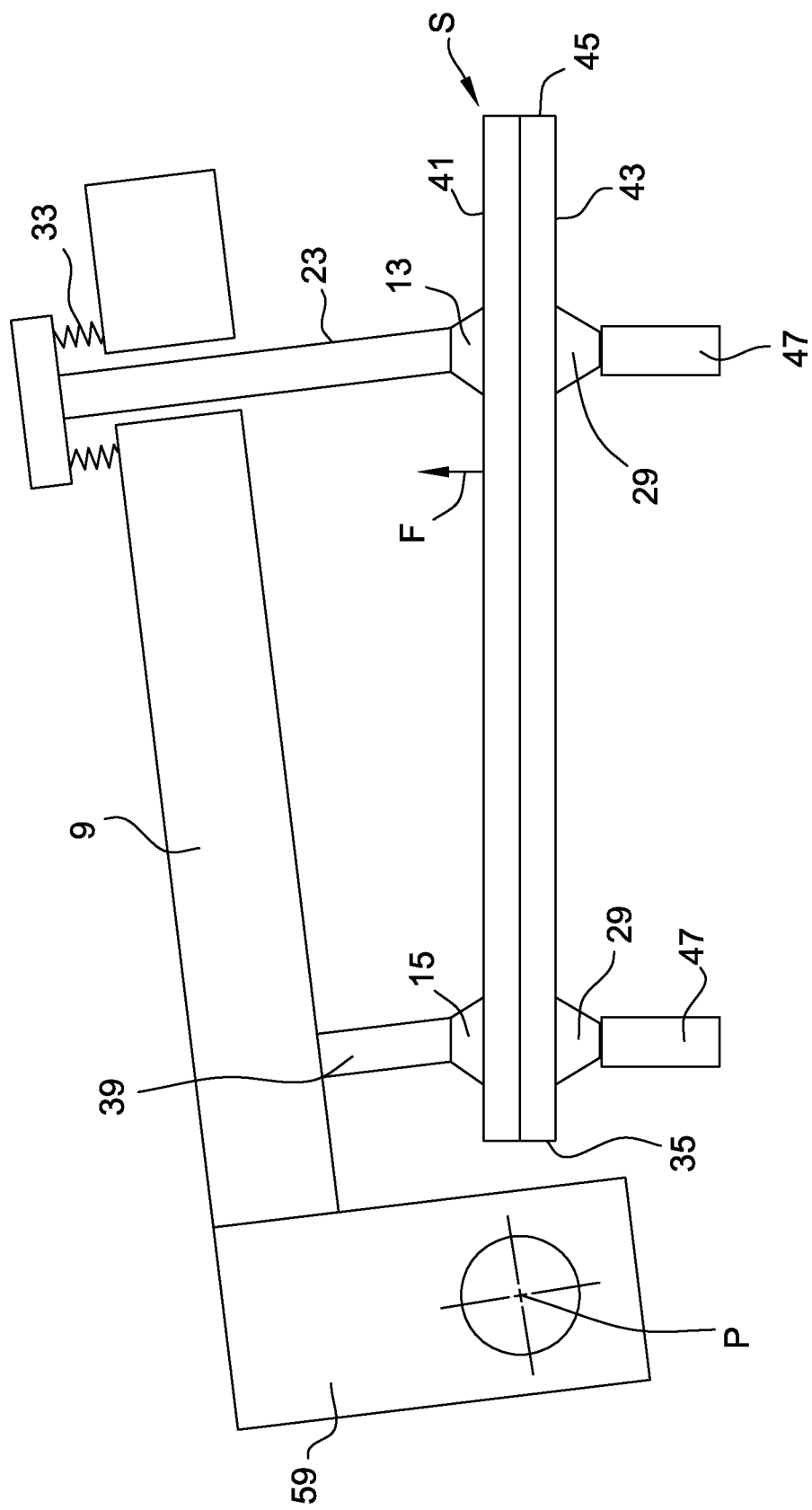
FIG. 6 is a schematic front view of the cleave system with the cleave arm in the raised position.
Figure 7:
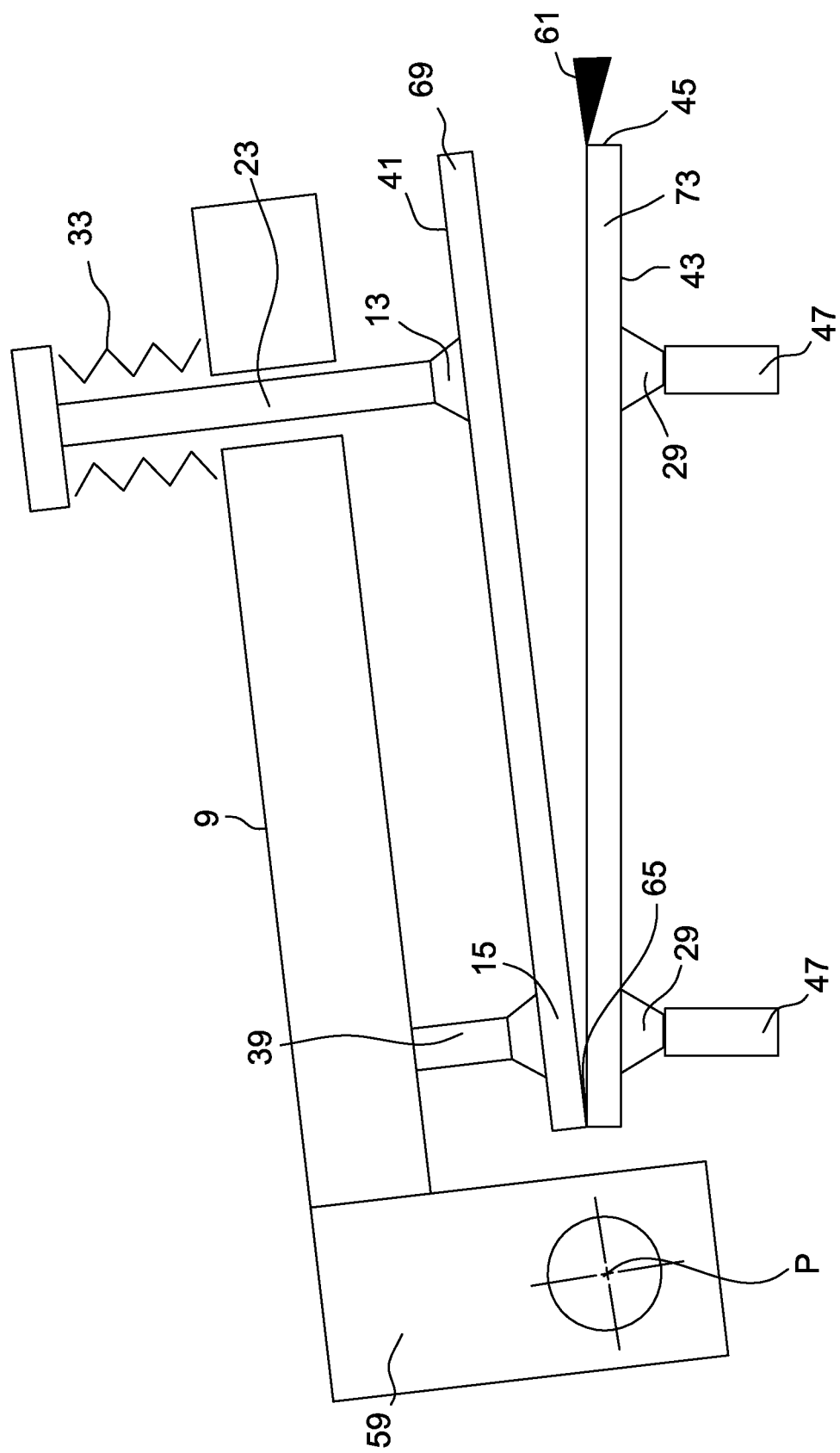
FIG. 7 is a schematic front view of the cleave system during cleaving as the spring members release stored energy.

After the semiconductor structure S is grasped, the cleave arm 9 is moved from its starting position (FIG. 5) to a raised position (FIG. 6). The cleave arm 9 is connected to a pivot structure 59 (FIG. 1). The cleave system 5 includes a motor 67 that causes the cleave arm 9 to pivot upon activation of the motor 67. The cleave arm 9 pivots about a pivot axis P that extends through the pivot structure 59. The motor 67 may be connected to the pivot structure 59 by a chain or belt or the motor 67 may be a direct-drive motor embedded in the pivot structure 59. The motor 67 may be a DC or AC servo motor and, optionally, may control acceleration, deceleration and/or velocity of the cleave arm 9.

As the cleave arm 9 moves from the starting position (FIG. 5) to the raised position (FIG. 6), the cleave arm 9 moves axially upward relative to the suction rods 23. This causes the spring members 33 to be compressed and to exert a cleave force F on the semiconductor structure S (i.e., an upward force which promotes cleaving of the semiconductor structure) and to store spring energy within the spring. In accordance with some embodiments of the present disclosure, the cleave arm 9 is not rotated to a point at which the spring are fully compressed and the spring retainer 57 contacts the cleave arm 9. Compression of the spring members 33 allows spring energy to be stored in the spring members 33 with the spring energy being released upon initiation of the cleave. The cleave force F applied by the spring members 33 (and any additional force through the motor) is transmitted through the suction rods 23. In the raised position of the cleave arm 9, the lower suction members 29 apply a holding force on the semiconductor structure S and the upward suction members 13, 15 apply an upward pull force such that the semiconductor structure S is in tension. In some embodiments, the cleave force F applied by the spring members 33 is the only cleave force applied to the semiconductor structure S (e.g., no upward forces other than the forces applied through the spring members 33 are used for cleaving). In some embodiments, the cleave arm is not moved upward after the cleave is propagated by the blade 61 (i.e., the spring members 33 cause the cleave to continue to propagate by releasing stored energy).

Once the cleave arm 9 is in the raised position (FIG. 6), a blade 61 is actuated to cause it to contact the peripheral edge 45 of the semiconductor structure S. The blade 61 may contact the peripheral edge near a damage region in the semiconductor structure to facilitate cleaving along the cleave plane. The blade 61 initiates the cleave along the cleave plane 65 (FIG. 7) causing the semiconductor structure S to separate into two pieces along the cleave plane 65. Once the blade 61 initiates the cleave, stored spring energy in the spring members 33 is released causing the suction rods 23 to move upward through the cleave arm 9 which causes the upper section 69 (FIG. 7) of the semiconductor structure S to continue to separate from the lower section 73.

In some embodiments, the cleave system is configured to be adjustable to control the quality of the cleave. For example, the system may include interchangeable springs members that have different spring rates to adjust the amount of energy stored and released during the cleave. In some embodiments, the cleave system include different types of interchangeable springs such as helical springs and stacked belleville springs. Helical springs may provide a linear cleave force as a function of displacement and belleville springs may provide a relatively constant suction cup force. Alternatively or in addition, the collar clamp 79 described above may be moved along the longitudinal axis of the suction rod to change the stroke of the spring member 33 and the energy stored and released by the spring members 33 during cleave propagation.

Compared to conventional cleave systems, the cleave systems of the present disclosure have several advantages. Use of spring members in the cleave system allows spring energy to be stored as the cleave arm is raised. Once the cleave is propagated by the blade, the energy of the springs is released to cause the semiconductor structure to separate into two pieces. This allows the cleave to be dependent on the stored spring energy rather than a cleave control system, cleave arm mass and/or the motor properties. This allows the cleave to be more consistent during propagation which reduces surface roughness of the cleaved surfaces and may reduce cleave arcs. In embodiments in which the cleave system includes a collar clamp, the collar clamp may be moved along the longitudinal axis of the suction rod to adjust the pre-compression of the spring member. In embodiments in which the cleave assembly includes a bellows suction cup, the cleave arm may move upward while still grasping the semiconductor structure S toward the cleave propagation trailing edge of the semiconductor structure. In other embodiments, pre-compression may be increased or decreased by modifying the design to relocate the attachment points of the spring.

EXAMPLES

The processes of the present disclosure are further illustrated by the following Examples. These Examples should not be viewed in a limiting sense.

Example 1: Spring Force Verse Compression

Figure 8:
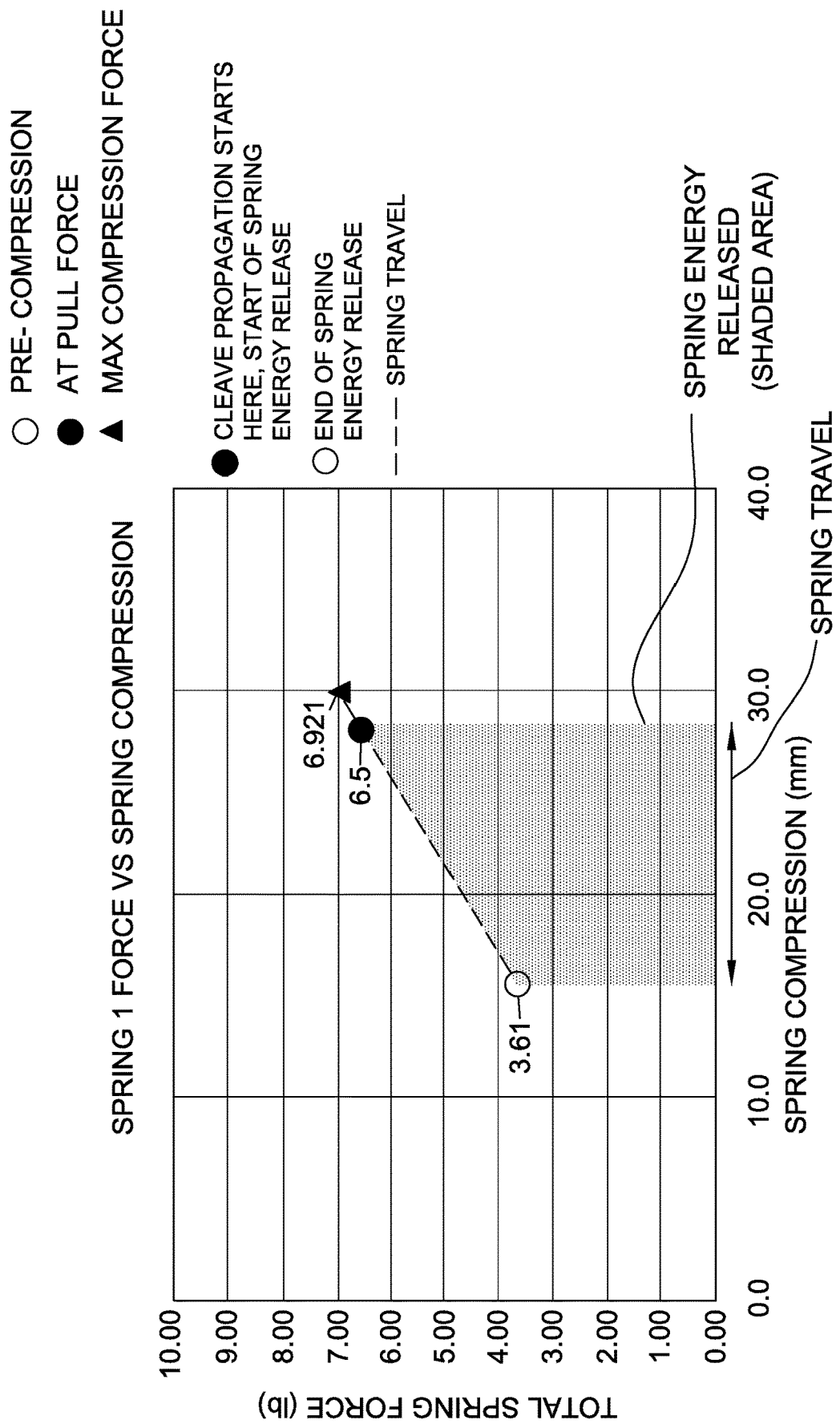
FIG. 8 is a graph of the total spring force as a function of spring compression for an example spring member.

FIG. 8 shows the total spring force as a function of spring compression. At the staring position of the cleave arm, the spring energy is 3.61 pounds. The spring was compressed about 12 mm to create a spring force of 6.5 pounds. The cleave was propagated and the spring energy was released to the pre-compression amount of 3.61 pounds. The spring was capable of creating a maximum compression force of 6.971 pounds. For wafers that cleave at a force of less than 6.971 pounds, the spring alone is sufficient for the cleave without the arm contributing to the cleave force. In some embodiments, the ending speed of the suction cups at the end of the cleave (3.61 pounds) would approximate or match the starting rotation speed of the cleave arm.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A cleave system for cleaving a semiconductor structure having a top surface and a bottom surface generally parallel to the top surface, the cleave system comprising:

a cleave arm that is moveable from a starting position to a raised position in which a cleave stress is applied to the semiconductor structure;
a suction member for grasping the semiconductor structure on the top surface of the semiconductor structure;
a suction rod that extends through the cleave arm, the suction rod being connected to the suction member toward a first end of the suction rod;
a spring member that applies a cleave force to the semiconductor structure when the cleave arm is in the raised position, the suction rod extending through the spring member; and
a collar that extends radially outward from the suction rod, the spring member being disposed between the collar and the cleave arm, the spring member being compressed when the cleave arm is in the raised position, the collar being part of a collar clamp that is adjustable along a longitudinal axis of the suction rod to change the compression of the spring member.

2. The cleave system as set forth in claim 1 wherein the spring member is a compression spring.

3. The cleave system as set forth in claim 1 wherein the suction member is a suction cup, the suction rod including a channel defined therein that is fluidly connected to the suction cup to apply a vacuum to the suction cup.

4. The cleave system as set forth in claim 1 wherein the suction member is a first suction member, the suction rod is a first suction rod, and the spring member is a first spring member, the cleave system comprising
a second suction member for grasping the semiconductor structure;
a second suction rod that extends through the cleave arm, the second suction rod being connected to the second suction member toward a first end of the second suction rod; and
a second spring member that applies a cleave force to the semiconductor structure when the cleave arm is in the raised position.

5. The cleave system as set forth in claim 4 further comprising:
a third suction member for grasping the semiconductor structure;
a third suction rod that extends through the cleave arm, the third suction rod being connected to the third suction member toward a first end of the third suction rod; and
a third spring member that applies a cleave force to the semiconductor structure when the cleave arm is in the raised position.

6. The cleave system as set forth in claim 1 wherein the cleave arm pivots about a pivot axis to move the cleave arm between the starting position to the raised position, the cleave system comprising a motor that causes the cleave arm to pivot upon activation of the motor.

7. The cleave system as set forth in claim 6 further comprising a bellows suction cup connected to the cleave arm, the bellows suction cup being disposed radially inward to the suction member.

8. The cleave system as set forth in claim 1 wherein the suction rod is not connected to the cleave arm.

9. The cleave system as set forth in claim 1 comprising one or more suction members for grasping the semiconductor structure on the bottom surface of the semiconductor structure.

* * * * *